United States Patent [19]

Fredrickson et al.

[11] Patent Number: 5,327,440
[45] Date of Patent: Jul. 5, 1994

[54] VITERBI TRELLIS CODING METHODS AND APPARATUS FOR A DIRECT ACCESS STORAGE DEVICE

[75] Inventors: Lyle J. Fredrickson, Sunnyvale, Calif.; James W. Rae, Rochester, Minn.

[73] Assignee: International Business Machines Corporation, Armonk, N.Y.

[21] Appl. No.: 776,142

[22] Filed: Oct. 15, 1991

[51] Int. Cl.[5] ............................................ G06F 11/10
[52] U.S. Cl. ................................................... 371/43
[58] Field of Search ....................... 371/43, 30, 55, 61

[56] References Cited

U.S. PATENT DOCUMENTS

| | | | |
|---|---|---|---|
| 4,483,012 | 11/1984 | Wei | 375/27 |
| 4,786,890 | 11/1988 | Marcus et al. | 341/81 |
| 4,823,346 | 4/1989 | Kobayashi et al. | 371/43 |
| 4,885,757 | 12/1989 | Provence | 375/96 |
| 4,888,775 | 12/1989 | Karabed et al. | 371/43 |
| 4,888,779 | 12/1989 | Karabed et al. | 371/43 |
| 4,945,538 | 7/1990 | Patel | 371/43 |
| 5,095,484 | 3/1992 | Karabed et al. | 371/30 |
| 5,220,466 | 6/1993 | Coker et al. | 360/46 |
| 5,257,263 | 10/1993 | Bazet et al. | 371/43 |
| 5,272,706 | 12/1993 | Park | 371/43 |

OTHER PUBLICATIONS

High-Rate Viterbi Processor: A Systolic Array Solution, IEEE vol. 8, No. 8, Oct. 1990, Gerhard Fettweis and Heinrich Meyr.

"Parallel Vitrbi Algorithm Implementation: Breaking the ACS Bottleneck", IEEE vol. 37, No. 8, Aug. 1989, Gerhard Fettweis and Heinrich Meyr.

"A VLSI Design for a Trace-Back Viterbi Decoder", IEEE, vol. 40, No. 3, Mar. 1992, T. K. Truong, Ming-Tang Shih, Irving S. Reed, E. H. Satorius.

"Application of Partial-response Channel Coding to Magnetic Recording Systems" H. Kobayashi and D. T. Tang, Jul. 1970, IBM J. Res. Development "Application of Probabilistic Decoding to Digital Magnetic Recording Systems" H. Kobayashi, Jan. 1971, IBM J. Res. Development.

"Trellis-Coded Modulation with Redundant Signal Sets, Part I", Gottfried Ungerboeck, IEEE Communications Magazine, Feb. 1987, vol. 25, No. 2.

"Signal Processing for High-Density Digital Magnetic Recording", F. Dolivo, Mar. 3, 1989, IBM Research Division, Zurich Research Laboratory.

"Correlative level coding for binary-data transmission", Adam Lender, Lenkurt Electric Company, Inc. C. Bernard Shung; Paul H. Siegel, Gottfried Ungerboeck, and Hemant K. Thapar; "VLSi Architecture for Metric Normalization in the Viterbi Algorithm"; IEEE Communications Magazine; pp. 1723-1728; Apr. 1990.

Primary Examiner—Robert W. Beausoliel, Jr.
Assistant Examiner—N. Wright
Attorney, Agent, or Firm—Joan Pennington; Richard E. Billion; Pryor A. Garnett

[57] ABSTRACT

Viterbi trellis coding methods and Viterbi detector apparatus are provided for detecting trellis coded data. A systolic array Viterbi detector recursively calculates path metrics and partial sums of metric update equations to determine codeword sequences having minimum mean squared error for Viterbi-type maximum-likelihood data detection. The systolic array Viterbi detector is arranged to eliminate redundant calculations and simplify hardware requirements. Modified butterfly trellis geometries and rotating state metrics arrangements are provided for simplifying the Viterbi detector.

12 Claims, 11 Drawing Sheets

VITERBI TRELLIS CODING METHODS AND APPARATUS FOR A DIRECT ACCESS STORAGE DEVICE

BACKGROUND OF THE INVENTION

1. Field of the Invention

The invention relates generally to Viterbi trellis coding methods and apparatus, and more particularly to Viterbi trellis coding methods and apparatus for partial-response maximum-likelihood (PRML) data channels in a direct access storage device (DASD).

2. Description of the Prior Art

Computers often include auxiliary memory storage units having media on which data can be written and from which data can be read for later use. Disk drive units incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Partial-response signaling with maximum-likelihood sequence detection techniques are known for digital data communication and recording applications. Achievement of high data density and high data rates has resulted in the use of a PRML channel for writing and reading digital data on the disks.

U.S. Pat. No. 4,786,890 discloses a class-IV PRML channel using a run-length limited (RLL) code. The disclosed class-IV partial response channel polynomial equals $(1-D^2)$, where D is a delay operator and $D^2$ is a delay of 2 bit times and the channel response output waveform is described by taking the input waveform and subtracting from it the same waveform delayed by a 2 bit interval. A $(0, k=3/k1=5)$ PRML modulation code is utilized to encode 8 bit binary data into codewords comprised of 9 bit code sequences, where the maximum number k of consecutive zeroes allowed within a code sequence is 3 and the maximum number k1 of consecutive zeroes in the all-even or all-odd sequences is 5.

Trellis coding techniques are used to provide a coding gain required in noisy or otherwise degraded channels. U.S. Pat. Nos. 4,888,775 and 4,888,779 describe trellis codes for PRML channels which provide significantly improved coding gains for transmission of digital data over PRML channels.

There is a need for improved Viterbi trellis code detectors that provide coding gains and bit rates required for transmission of digital data over PRML channels while reducing the number of calculations involved in the Viterbi algorithm, and reducing and simplifying the required digital hardware.

SUMMARY OF THE INVENTION

Important objects of the present invention are to provide a Viterbi trellis detector that can be effectively and efficiently configured for transmission of digital data over PRML channels; to provide a Viterbi trellis detector that eliminates redundant calculations; to provide a Viterbi trellis detector that reduces and simplifies hardware requirements and to provide a Viterbi trellis detector that is easily configured for various trellis codes.

In brief, the objects and advantages of the present invention are achieved by trellis coding methods and Viterbi detector apparatus for detecting trellis coded data. A systolic array Viterbi detector recursively calculates path metrics and partial sums of metric update equations to determine codeword sequences having minimum mean squared error for Viterbi-type maximum-likelihood data detection. The systolic array Viterbi detector is arranged to eliminate redundant calculations. Modified butterfly trellis geometries and rotating state metric arrangements are provided for simplifying the Viterbi detector.

BRIEF DESCRIPTION OF THE DRAWING

The present invention together with the above and other objects and advantages may best be understood from the following detailed description of the embodiment of the invention illustrated in the drawings, wherein.

DETAILED DESCRIPTION OF THE PREFERRED EMBODIMENT

Figure 1:
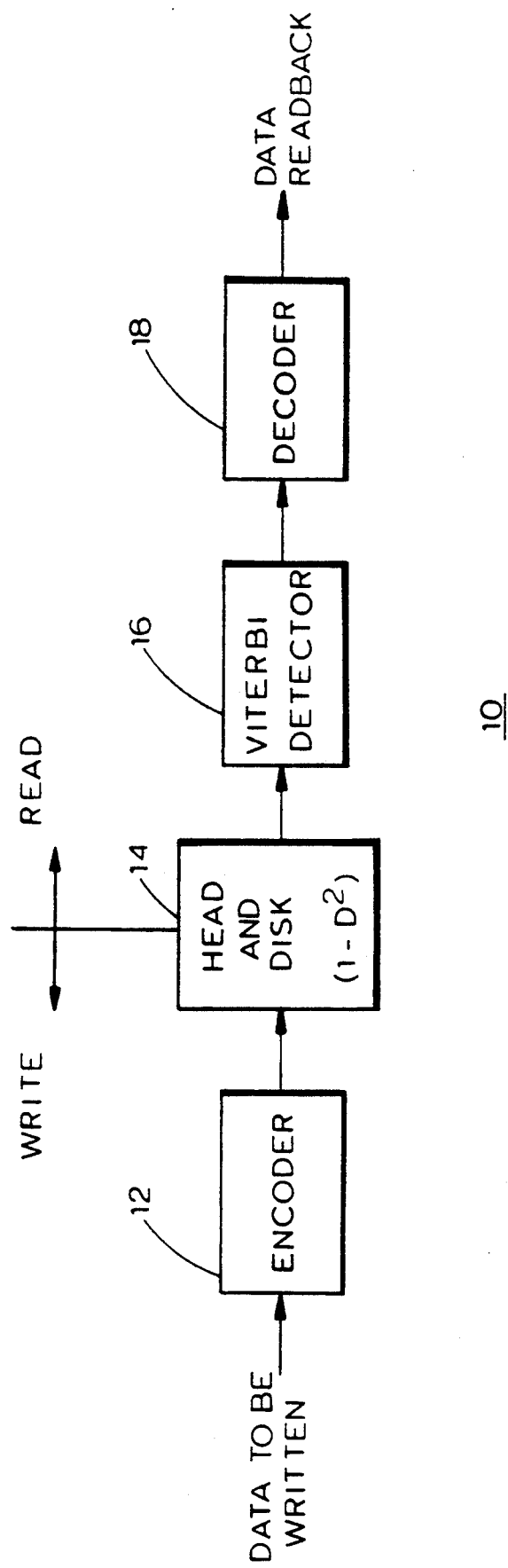
FIG. 1 is a block diagram representation of a partial-response maximum-likelihood channel including an encoder, a Viterbi detector and a decoder according to the invention.

Referring now to FIG. 1, there is shown a block diagram of a partial-response maximum-likelihood (PRML) recording channel 10 in a direct access storage device for carrying out the Viterbi trellis coding detector methods of the invention. Data to be written, such as in the form of a binary symbol string, is applied to an encoder 12. Encoder 12 produces trellis coded data or codewords which serve as an input to a class-IV partial-response (PR) channel 14 described by a $(1-D^2)$ operation. A channel output is generated by the channel 14 and detected at the channel output by a Viterbi detector 16 coupled to a decoder 18 to complete the maximum-likelihood (ML) detection process for data readback.

The PR class-IV channel transfer function $(1-D^2)$ is equivalent to two independent interleaved dicode channels each displaying a transfer function described by $(1-D)$ where D represents one interleaved sample delay. Input data bytes are separated into two sequences, odd and even. Encoder 12 is applied to the odd or even byte streams to produce MSN encoded data which is re-interleaved and applied to the channel 14. One encoder may be used for both odd and even data streams by pipelining. Detected data is separated into odd and even sequences which are independently decoded. The decoded data is re-interleaved to reproduce channel input data.

Encoder 12 can produce a matched spectral null (MSN) trellis code, for example, with a rate of 8/10 particularly suitable for magnetic recording. With the rate 8/10 MSN code, a 10 bit trellis encoded block or codeword is generated for every 8 bit byte of data input. A discrete time state diagram of the generated codes can be described as a path through a trellis. With trellis codes, codewords are selected on the basis of being maximally different from one another with a requirement that codeword sequences have large distance in Euclidian signal space.

The Viterbi detector 16 used at the output of the channel 14 determines which of the allowed codeword sequences most closely matches received data. The degree of match is measured by mean squared error between received data and allowed codewords. The codeword sequence that displays the smallest mean squared error is most likely the correct sequence. Because codewords were selected on the basis of large Euclidian distance and mean squared error is used as a basis for detection, code redundancy provides an improvement in SNR. The increased distance properties of the code more than compensate for loss of capacity caused by code redundancy.

Figure 2:
FIGS. 2 and 3 are graphs illustrating survivor paths through a six state trellis for a rate 8/10 MSN code on a dicode (1-D) channel.
Figure 3:
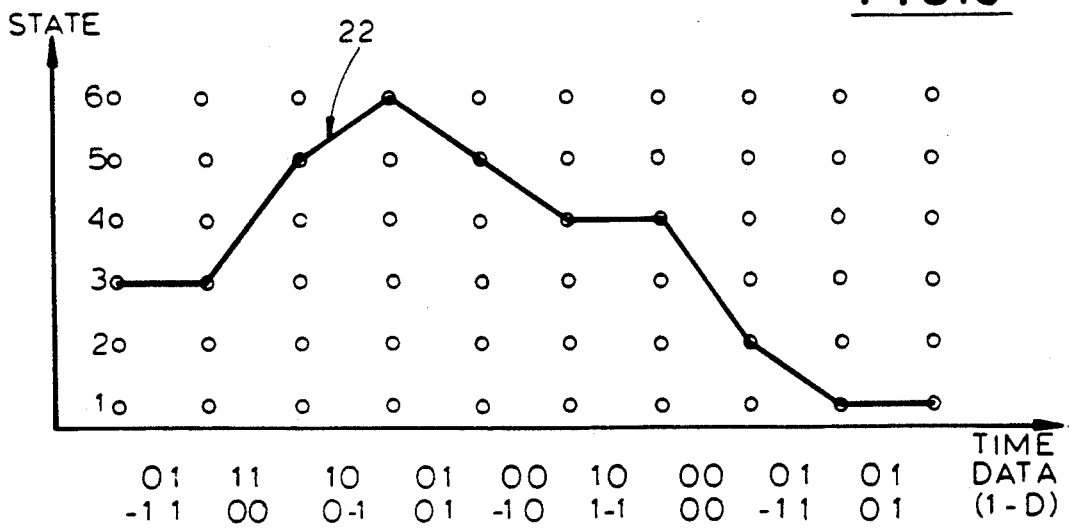
Figure 4:
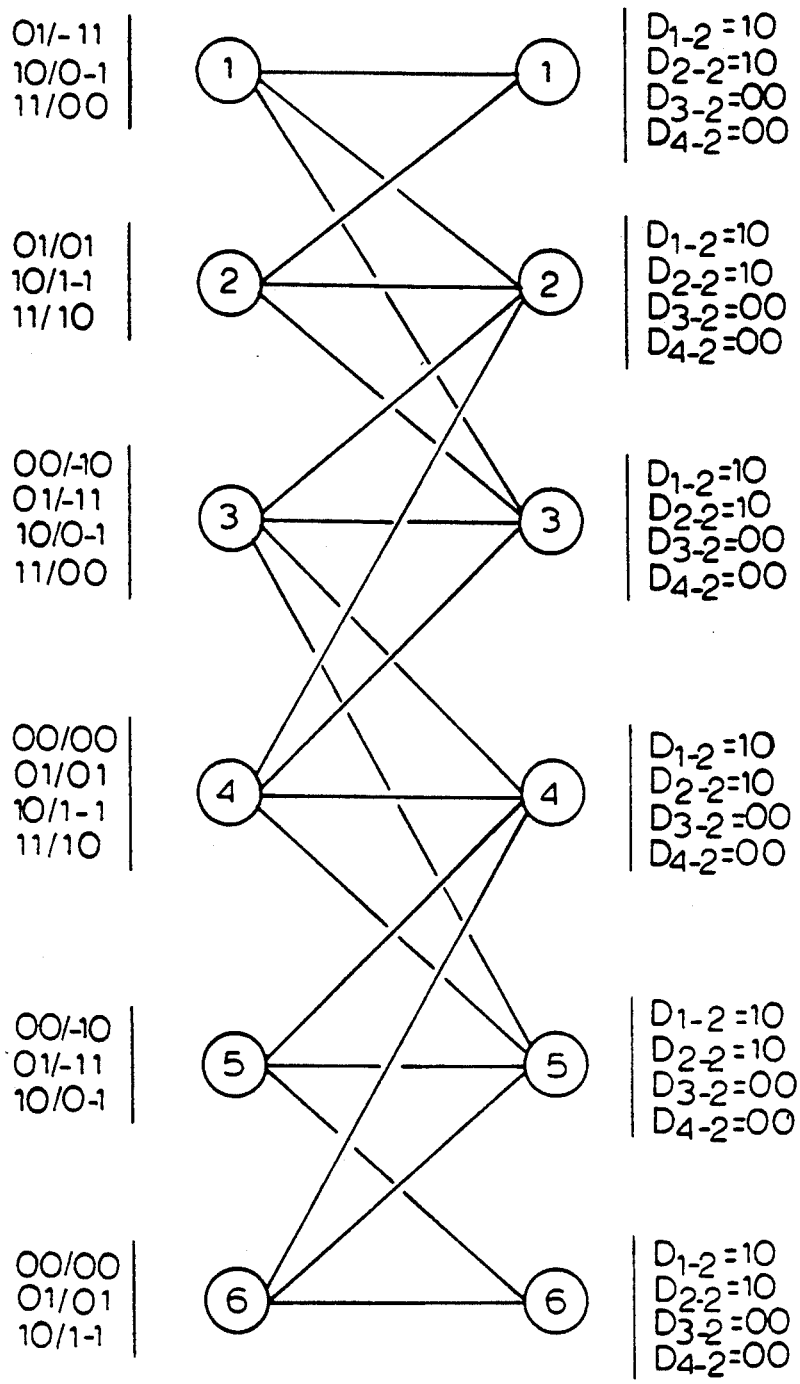
FIG. 4 is a six state trellis transition diagram illustrating all allowed state transitions for a rate 8/10 MSN code on a dicode (1-D) channel.

FIGS. 2 and 3 illustrate a six state trellis diagram in discrete time with time along the abscissa or x axis and the six states along the ordinate or y axis. FIG. 4 provides a six state trellis transition diagram illustrating all allowed state transitions for a rate 8/10 MSN code on a dicode (1-D) channel as disclosed in U.S. Pat. No. 4,888,779. Note that each transition represents two encoded bits.

In FIGS. 2 and 3 the trellis diagrams include solid lines with dots between each signalling time interval illustrating the path of an example codeword sequence for a rate 8/10 MSN code on a dicode (1-D) channel. At any given discrete point in time, encoder 12 may be in one of 6 states—1, 2, 3, 4, 5 or 6 as shown in FIGS. 2, 3 and 4.

Encoded data follow only one unique path through the trellis, and each transition between states represents two bits of encoder output. As an encoded bit stream is generated, the data can be thought of as following a continuous path through the trellis. An encoded bit stream DATA is shown together with $(1-D)$ partial response channel output, which may be considered as ideal noiseless amplitude samples $\{z_i\}$. Illustrated codeword sequences are defined by the indicated paths generally designated 20 and 22 through the trellis in FIGS. 2 and 3. For the rate 8/10 MSN code, the codewords of length 10 bits are generated by paths of length 5 in the trellis diagrams in FIGS. 2 and 3. Paths 20 and 22 include four codewords corresponding to the encoded bit stream DATA and partial-response channel output (1-D) listed below the diagrams.

By inverting the coding process, data detection from noise corrupted samples at the output of the channel may be redefined as follows. Given discrete time analog channel output samples, $\{z_i\}$, select the one path through the trellis which best matches received data. Or more precisely, select that path which has the minimum squared error.

Figure 5:
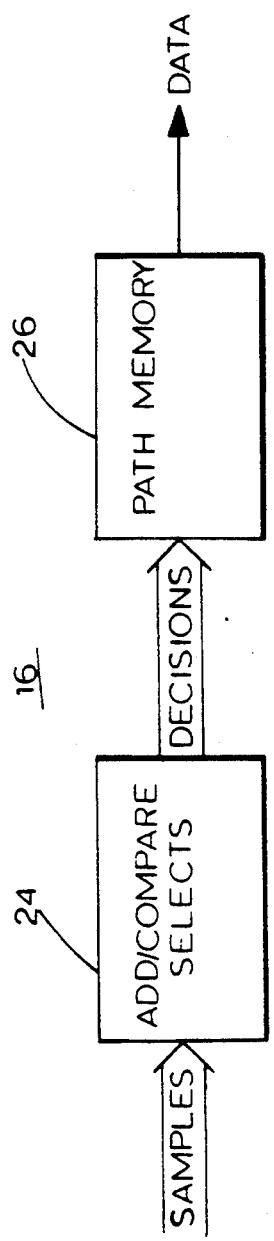
FIG. 5 is a block diagram illustrating a Viterbi detector of FIG. 1.

Referring to FIG. 5, there is shown a block diagram illustrating data flow through the Viterbi detector 16. An add, compare and select function 24 receives samples and makes ACS decisions applied to a path memory 26 that stores sequential ACS decisions. An ACS function adds two numbers to form a sum, the sum is compared to a third number and the smaller of the two outputted. The stored sequences of ACS decisions represent paths through the MSN trellis resulting in detected data. Viterbi detector 16 employs the Viterbi detection algorithm to determine the most likely path through the trellis. The Viterbi detection algorithm functions in a recursive manner computing extensions to the trellis for every two samples. Accumulated error and path history are stored for each state, and the trellis is extended by recursion one 2-bit increment at a time.

The algorithm stores total accumulated error, $M_n(k)$, of each path through the trellis ending at a state k. At time $n=0$, $M(k)=0 \forall k$. To extend the trellis a cost function called a branch metric is computed for each transition. The branch metrics measure how well a state transition matches the received data, and are functions of consecutive (1-D) channel output samples $z_1$, $z_2$. Branch metrics are defined as follows:

$B_{1\text{-}1} = \{2+2z_1-2z_2\}$
$B_{2\text{-}1} = \{1-2z_2\}$
$B_{1\text{-}2} = \{1+2z_2\}$
$B_{2\text{-}2} = \{2-2z_1+2z_2\}$
$B_{3\text{-}2} = \{1+2z_2\}$
$B_{4\text{-}2} = \{0\}$
$B_{1\text{-}3} = \{0\}$
$B_{2\text{-}3} = 1-2z_1\}$
$B_{3\text{-}3} = \{2+2z_1-2z_2\}$
$B_{4\text{-}3} = \{1-2z_2\}$
$B_{3\text{-}4} = \{1+2z_2\}$
$B_{4\text{-}4} = \{2-2z_1+2z_2\}$
$B_{5\text{-}4} = \{1+2z_1\}$
$B_{6\text{-}4} = \{0\}$
$B_{3\text{-}5} = \{0\}$
$B_{4\text{-}5} = \{1-2z_1\}$
$B_{5\text{-}5} = \{2+2z_1-2z_2\}$
$B_{6\text{-}5} = \{1-2z_2\}$
$B_{5\text{-}6} = \{1+2z_2\}$
$B_{6\text{-}6} = \{2-2z_1+2z_2\}$ Branch metrics $B_{1\text{-}1} - B_6$ and are then added to their respective path metrics to calculate total accumulated error for all path transitions ending in a given state for time $n+1$. One path, the survivor with the smallest error, is selected for each state so that six survivors are chosen. The operation to choose each survivor is add, compare, and select (ACS), where a compare and select function selects the transition or edge with the smallest cumulative error.

Path metrics or accumulated error are next updated as follows: For each k, $M_{n+1}(k)$ becomes $\min\{B_{p\text{-}k}+M_n(p)\}$; where the minimum is taken over all values of p; that value of p selected determines the survivor path from state p to state k.

Also, path histories are updated as follows: For each k, the path history for state k is updated by, $PH_{n+1}(k)$ becomes $D_{p\text{-}k}$ concatenated with $PH_n(p)$; where the value of p is determined in the previous minimization and $D_{p\text{-}k}$ equals the two data bits each survivor represents and $PH_n(p)$ is a path history of previously chosen data bits $D_{p\text{-}k}$'s for state p. Note that the chosen transition also transfers its path history, (from p) and the previous path history for node k is discarded. As the trellis is extended, both path history and path metrics grow and change with each time n.

All add, compare and select functions required for the rate 8/10 MSN code are described by the following metric update equations:

$$M(1)_{n+1} = \min\{M_n(1)+2+2z_1-2z_2,\\ M_n(2)+1-2z_2\}$$

$$M(2)_{n+1} = \min\{M_n(1)+1+2z_2,\\ M_n(2)+2-2z_1+2z_2, M_n(3)+1+2z, M_n(4)\}$$

$$M(3)_{n+1} = \min\{M_n(1),M_n(2)+1-2z_1,M_n(3)+2+2z_1-2z_2, M_n(4)+1-2z_2\}$$

$$M(4)_{n+1} = \min\{M_n(3)+1+2z_2,M_n(4)+2-2z_1+2z_2,\\ M_n(5)+1+2z_1, M_n(6)\}$$

$$M(5)_{n+1} = \min\{M_n(3),M_n(4)+1-2z_1,M_n(5)+2+2z_1-2z_2,M_n(6)+1-2z_2\}$$

$$M(6)_{n+1} = \min\{M_n(5)+1+2z_2,M_n(6)+2-2z_1+2z_2\}$$

Referring to FIG. 4 as an example of an ACS function for one state, consider the mean squared error of each path ending in state 2:
$e_1 = B_{1\text{-}2} + M_n(1) = \{1+2z_2\} + M_n(1)$
$e_2 = B_{2\text{-}2} + M_n(2) = \{2-2z_1+2z_2\} + M_n(2)$
$e_3 = B_{3\text{-}2} + M_n(3) = \{1+2z_2\} + M_n(3)$
$e_4 = B_{4\text{-}2} + M_n(4) = \{0\} + M_n(4)$
assuming $e_3$ is smallest, compare and select to find: $e_3 = \min\{e_1, e_2, e_3, e_4\}$ The transition, $3 \rightarrow 2$ is selected as minimum error, with $D_{3\text{-}2} = 00$, then: $M_{n+1}(2) \rightarrow e_{min}$ and $PH_{n+1}(2) \rightarrow 00$, $PH_n(3)$ The path history of the source state is concatenated to the new data bits to form an updated path history of the data sequence ending in state 2.

The add, compare and select process is performed for each state producing six new path extensions, six new updated path metrics and six updated path histories for each time n. As path histories grow while the trellis is extended, it is found that some paths die out. If we look back in time far enough then only one path survives. Since this path represents the minimum error path through the trellis, it is defined as detected data.

As a property of the rate 8/10 MSN code, path histories may be truncated to 44 bits. Path metrics are renormalized by one of several known methods to prevent overflow, for example, such as described in "VLSI Architectures for Metric Normalization in the Viterbi Algorithm" by C. Bernard Shung, Paul H. Siegel, Gottfried Ungerboeck and Hemant K. Thapar; April 1990 IEEE 347.4.1; pages 1723-1328.

Figure 6:
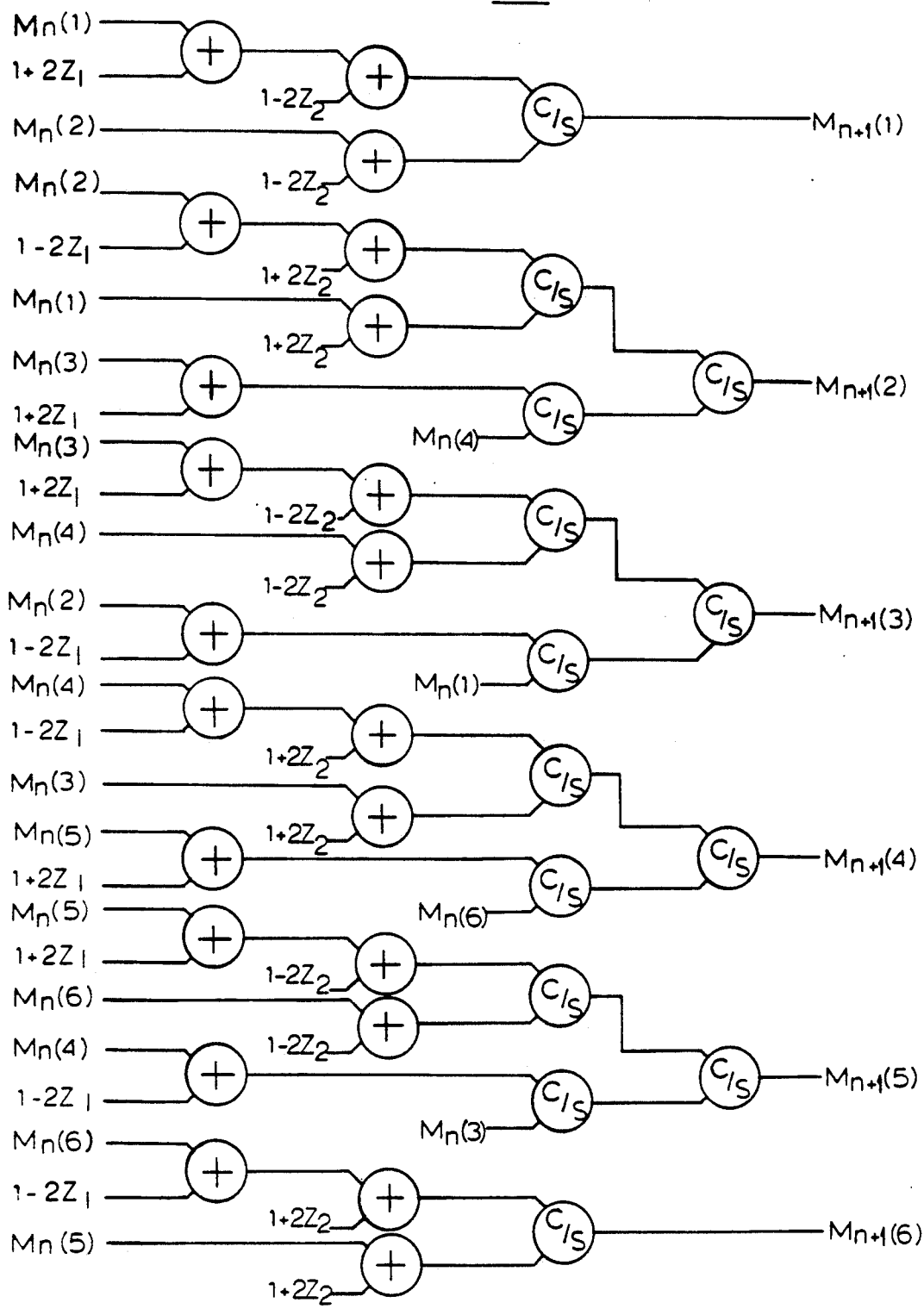
FIG. 6 is a schematic diagram illustrating a direct Viterbi detector arrangement.

Referring to FIG. 6, there is shown a direct implementation generally designated 30 of the Viterbi algorithm for Viterbi detector 16. As shown, twenty-two 2-input adders +, fourteen 2-input compare/selects C/S and path history memory are required. Viterbi arrangement 30 limits potential applications of Viterbi detection due to the amount of required digital hardware and present technology.

In accordance with a feature of the invention, the metric update equations may be rewritten as follows:

$$M_{n+1}(1) = \min\{(1-2z_2) + \min[M_n(1)+(1+2z_1),M_n(2)]\}$$

$$M_{n+1}(2) = \min\{\min[M_n(3)+(1+2z_1),M_n(4)],(1+2z_1)+\min[M_n(2)+(1-2z_1),M_n(1)]\}$$

$$M_{n+1}(3) = \min\{\min[M_n(2)+(1-2z_1),M_n(1)],(1-2z_2)+\min[M_n(3)+(1+2z_1),M_n(4)]\}$$

$$M_{n+1}(4) = \min\{\min[M_n(5)+(1+2z_1),M_n(6)],(1+2z_2)+\min[M_n(4)+(1-2z_1),M_n(3)]\}$$

$$M_{n+1}(5) = \min\{\min[M_n(4)+(1-2z_1),M_n(3)],(1-2z_2)+\min[M_n(5)+(1+2z_1),M_n(6)]\}$$

$$M_{n+1}(6) = \min\{(1+2z_2)+\min[M_n(6)+(1-2z_1),M_n(5)]\}$$

In accordance with the invention, Viterbi detector 16 is implemented by applying the Viterbi algorithm where parts of the metric computation become redundant and regular. Note, for example, the last part of equation $M_{n+1}(2)$ is the same as the first part of equation $M_{n+1}(3)$. Also, the metric calculations have a regular pattern displaying the following basic structure: $\min[M_n(k)+(1+2z_1 \text{ or } 2z_2), M_n(p)]$, where p represents adjacent states.

Figure 7:
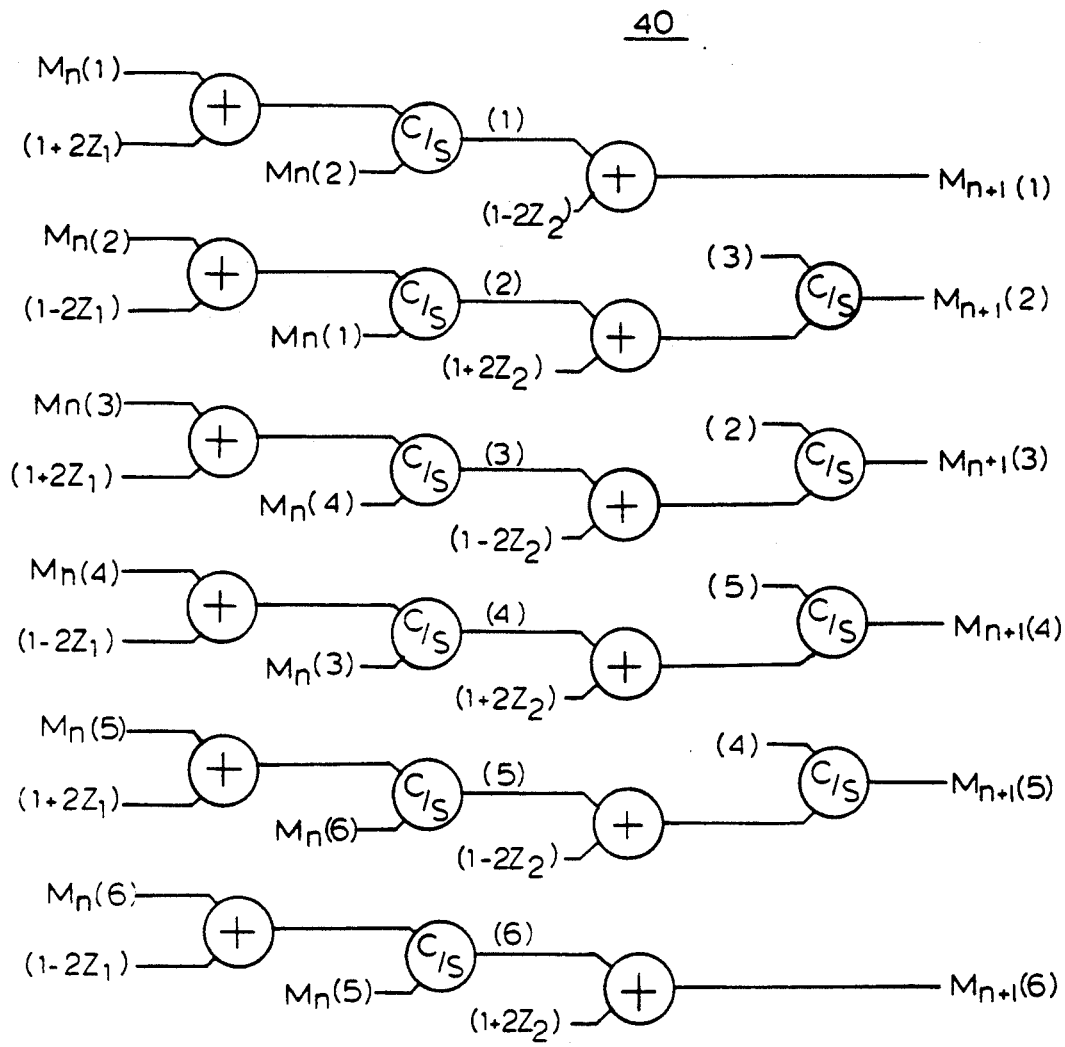
FIG. 7 is a schematic diagram illustrating an alternative, simplified Viterbi detector arrangement according to the invention.

FIG. 7 shows the schematic representation of the above rewritten metric update equations generally designated 40 of the Viterbi algorithm for Viterbi detector 16. As shown, the Viterbi detection algorithm is implemented with twelve repeated structures including twelve 2-input adders +, ten 2-input compare/selects C/S and path history memory.

Figure 8:
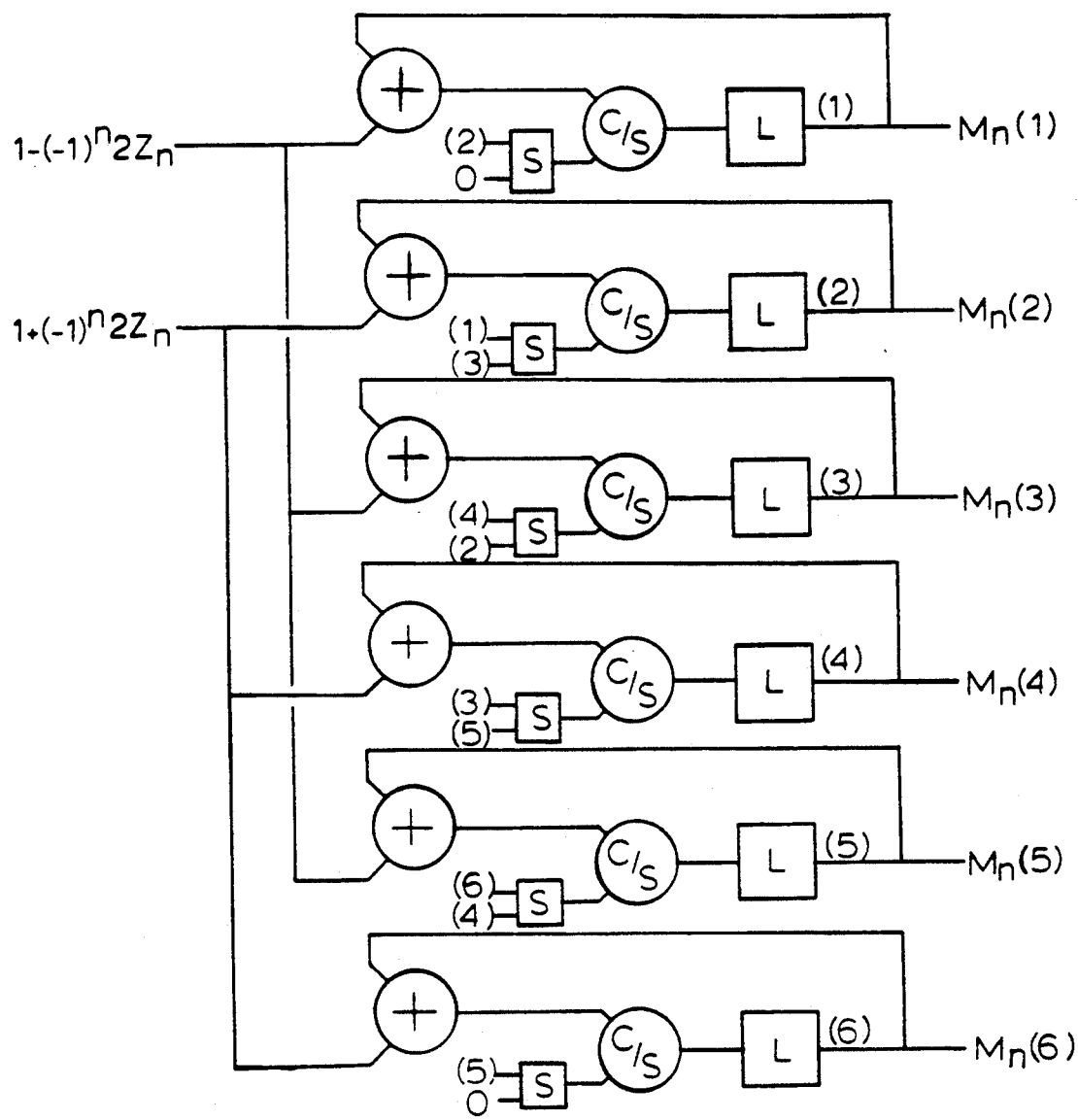
FIG. 8 is a schematic diagram illustrating a second alternative, simplified Viterbi detector arrangement according to the invention.

FIG. 8 illustrates a further alternative circuitry generally designated 50 exploiting further regularity of the above rewritten metric update equations. Viterbi detector 50 is a simplified systolic array used recursively to reduce the required hardware logic and eliminate redundant calculations. Viterbi detector 50 performs the ACS operation using the same basic structure in cascade. Viterbi detector 50 is adapted for recursively computing the left half of detector 40 in FIG. 7, storing the result in a 12 bit wide latch L. Viterbi detector 50 includes six ACS's comprised of six 2-input adders +, six 2-input compare/selects C/S and six 2-input selects or multiplexers S clocked to facilitate the recursive calculations. The same latches L alternately store path metrics, $M_n(k)$'s and partial sums, $M'_n(k)$'s. The logic is clocked at the encoded bit rate, and amplitude samples of alternating polarity, $\{\pm z_i\}$, are inputted sequentially. The C/S compares and selects between $M_n(i)$ a metric, or $M'_n(j)$, a partial sum, on n alternate clock cycles, where i and j are adjacent states in FIG. 8. Compare and select decisions are recorded in path history registers (not shown). The same number of path metric latches are needed for implementations 40 and 50.

Figure 9:
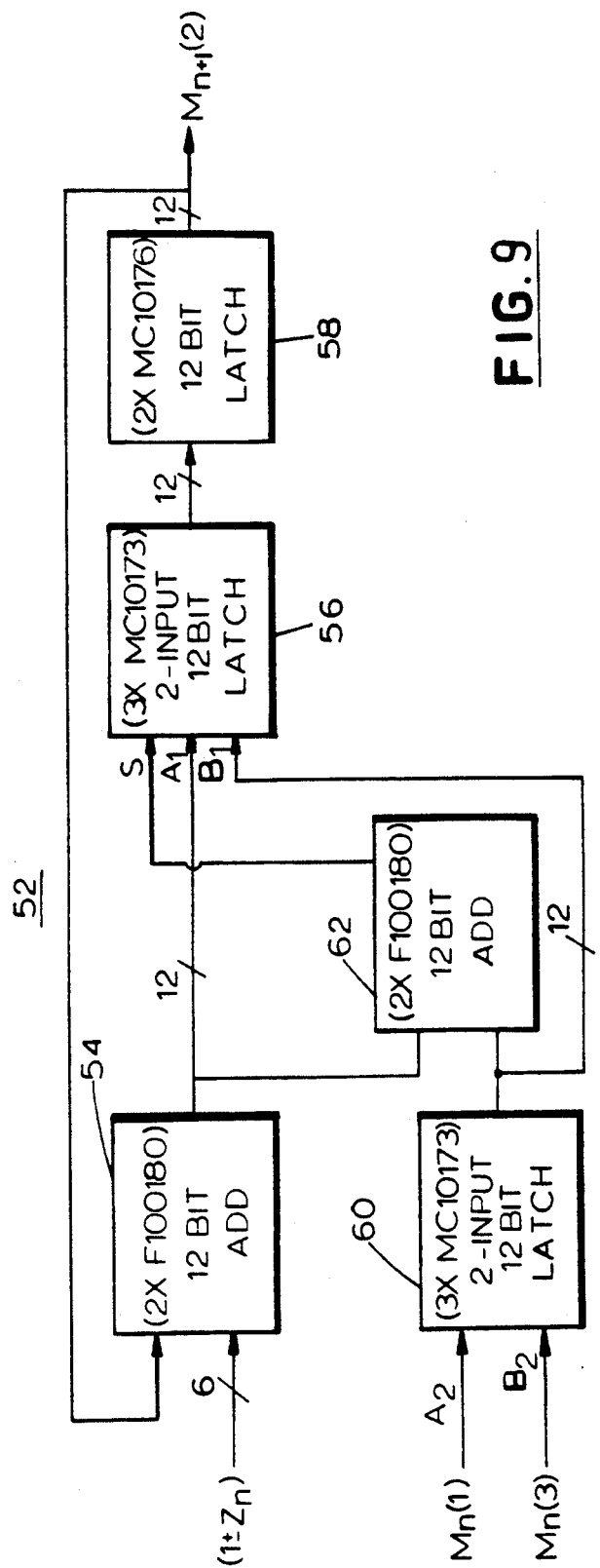
FIG. 9 is a schematic diagram illustrating add, compare, and select (ACS) calculation circuitry for a single metric update equation according to the invention.

FIG. 9 illustrates an example ECL circuit implementation 52 for a single $M_{n+1}(2)$ ACS calculation including a first 12-bit add 54, three 2-input 12-bit latches 56, 58 and 60 and a second 2-input 12-bit add 62. Inputs to latch 60 represent a bitwise complement of $M_n(1)$ and partial sum $M'_n(3)$. Pipelined latches 56 n and 58 have been added so that odd and even bit streams needed for a $(1-D^2)$ PR channel can be detected independently.

Figure 10:
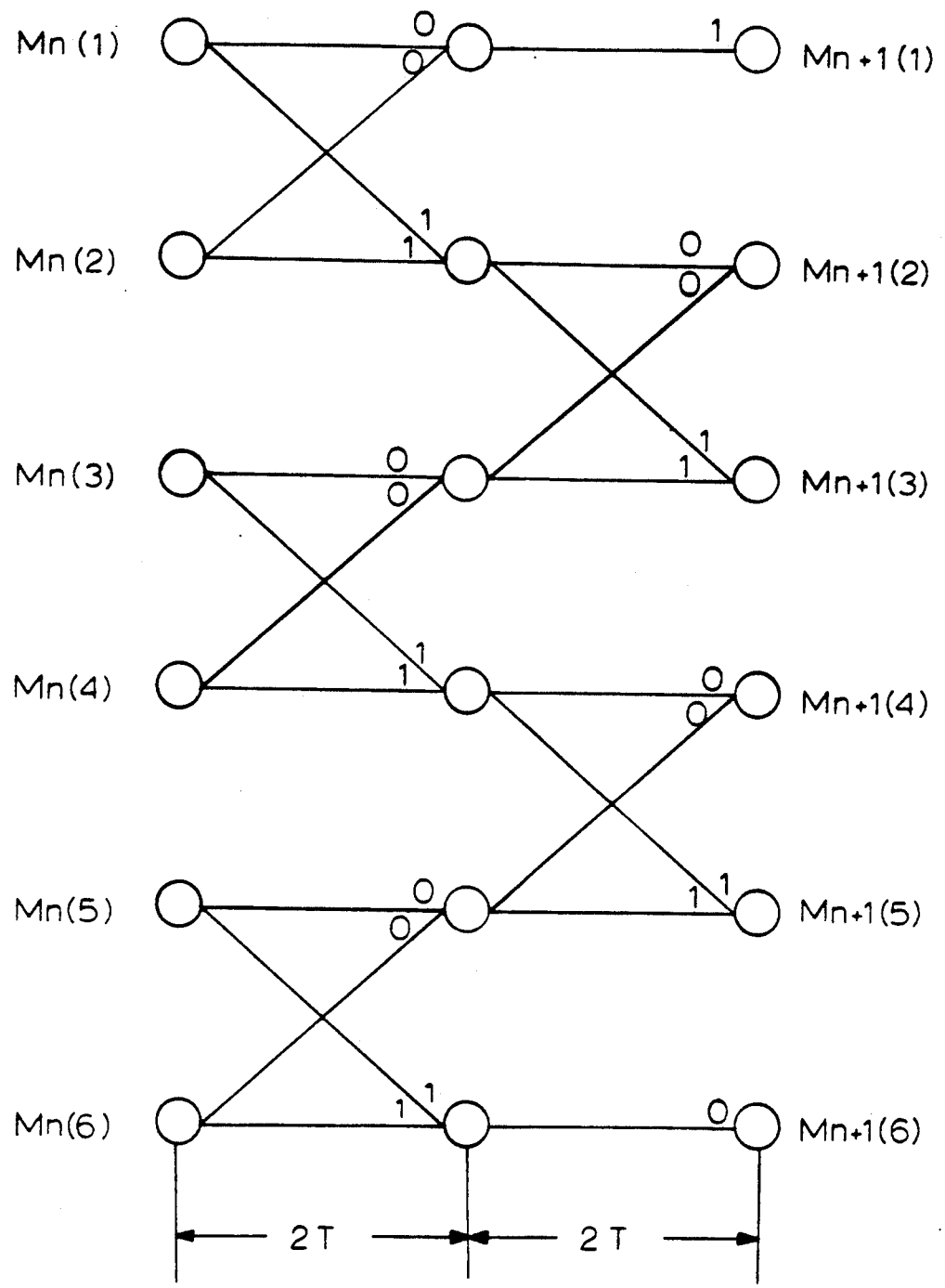
FIG. 10 is a six state trellis transition diagram illustrating a modified butterfly trellis according to the invention.

FIG. 10 illustrates a modified butterfly trellis according to the invention generally designated 80 adapted for simplifying the path memory and equivalent to the above rewritten metric update equations. Butterfly trellis 80 operates at the sample rate of the dicode (1-D) channel, during which 2 samples (odd and even) are received from the PR class-IV channel. The MSN code is interleaved and applied to the class-IV partial-response channel having a transfer response $(1-D^2)$, with one sample time corresponding to 2 encoded bit times. Butterfly trellis 80 includes alternating zeroes 0 and ones 1 along horizontal and diagonal transitions representing non-return to zero (NRZ) labelling of the channel inputs corresponding to a given state transition.

Figure 11:
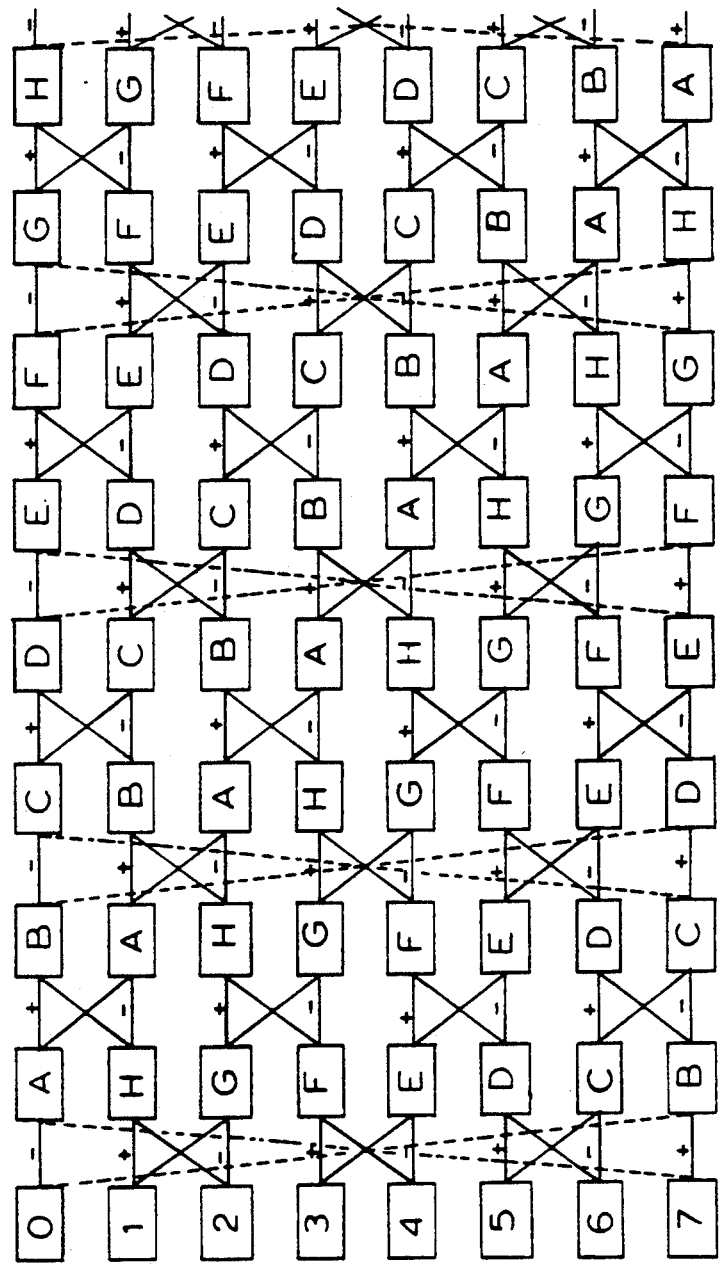
FIG. 11 is an eight state trellis transition diagram illustrating a modified butterfly trellis according to the invention.

FIG. 11 shows an eight state trellis transition diagram generally designated 90 illustrating a modified butterfly trellis according to the invention. Modified eight state butterfly trellis 90 can be used for tracking the running digital sum (RDS) or RDS modulo N, where N is an even integer 8. Illustrated trellis 90 tracks the RDS to within eight distinct values or RDS mod 8, although it should be understood the architecture of trellis 90 is not limited to this specific example and can be used to track RDS modulo N, where N is any even positive integer.

Horizontal edges in the trellis 90 represent non-return-to-zero inverted (NRZI) ones and diagonal edges represent NRZI zeroes. NRZI ones are considered to be transitions producing non-zero noiseless sample values at the output of a dicode (1-D) channel which alternate in sign. The alternating non-zero noiseless samples or NRZI one is illustrated in FIG. 11 by a label of "+" indicating a positive noiseless sample value, and a "−" indicating a negative noiseless sample value. NRZI zeroes produce noiseless sample values of zero at the channel output. The long, dotted diagonal edges between vertices labelled 0 and 7 represent an optional addition which is used when tracking the RDS mod 8; these edges are deleted when tracking the actual RDS.

If NRZI transitions occur in the center of a bit cell, a NRZI one does not alter the net RDS of a given sequence, and therefore vertical levels within FIG. 11 may be considered lines of constant RDS. A NRZI zero results in a change of one in RDS having a direction depending on the number of previous NRZI ones being odd or even. This is reflected in the nature of the solid diagonal edges in FIG. 11, whose direction changes only by taking a horizontal edge corresponding to an NRZI one. If the RDS mod 8 trellis is viewed as a cylinder, then NRZI zeroes may be viewed as circumscribing the cylinder in a constant direction.

In FIG. 11 the vertices represent the point where ACS functions determine the more likely transition edge based on calculated metrics for noisy channel sample values, and accordingly update the metrics and path histories to reflect decisions made.

Conventionally a path memory is assigned to keep track of the decisions made along a given row of the trellis 90. When a decision along a given row is the horizontal edge, the path memory is updated by shifting the previous decisions ahead one bit, and inserting a one at the end of the path memory. When the decision is the diagonal edge, the path memory is loaded in parallel with the shifted decisions from either of the neighboring RDS path memories, depending on whether it is an odd or even cycle, and a zero is inserted at the end of the path memory. In a conventional path memory architecture, all but the end bit of each path memory passes through a three-way multiplexer into a path memory register. As the number of vertical vertices and the length of each path memory grows, it is advantageous to adopt an architecture which implements the path memories more efficiently.

Figure 12:
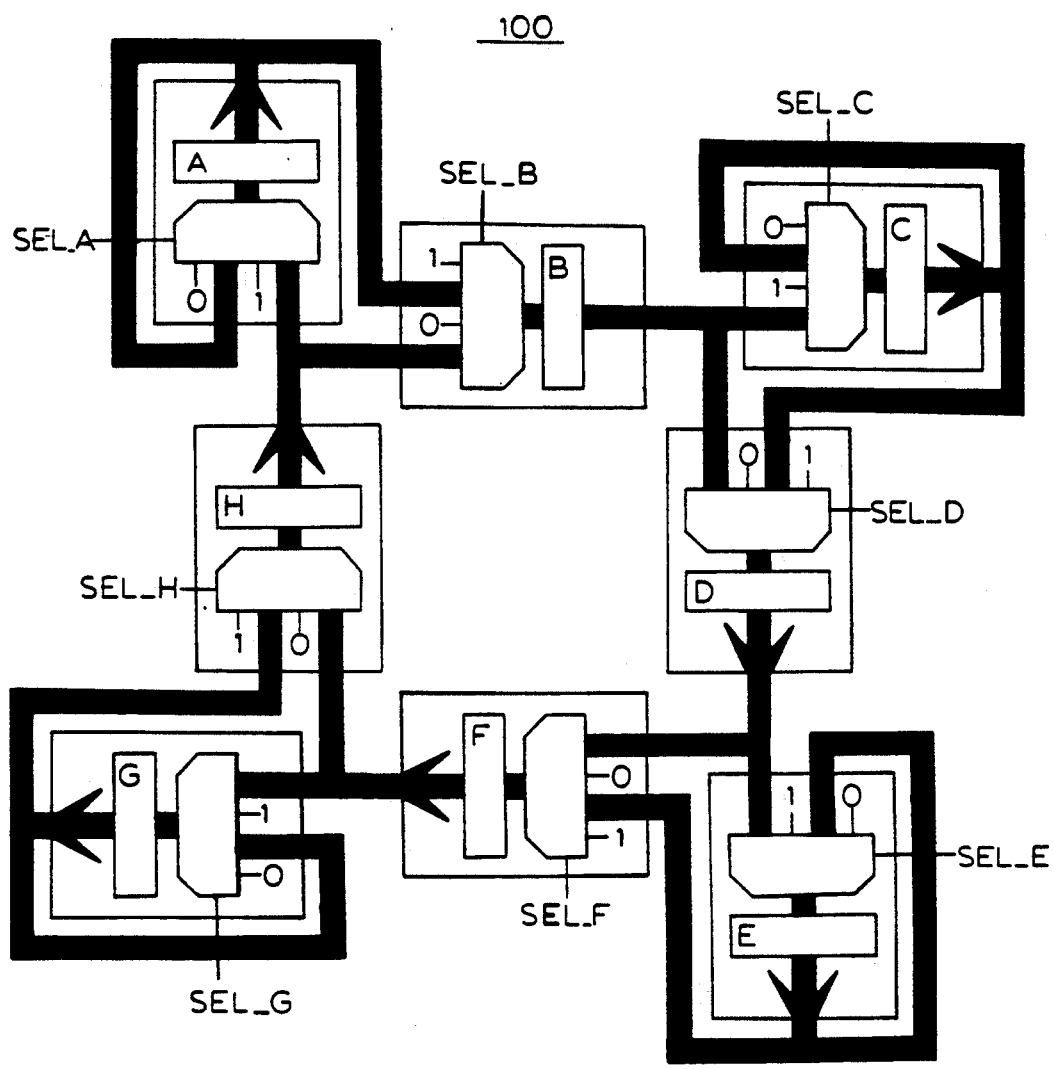
FIG. 12 is a schematic diagram illustrating a path memory circuitry according to the invention for use with the butterfly trellis of FIG. 11.

In FIG. 12 there is shown a simplified path memory architecture 100 in accordance with the present invention. Each block in FIG. 2 represents a path memory, and the interconnection represents the routing for all but the end bit of each path memory. Two repetitive structures are apparent. The central blocks, labelled B, D, F, and H, represent parallel registers with a two-way multiplexer selecting each input bit. The corner blocks, labelled A, C, E, and G, represent shift registers with a parallel loading capability. Path memory architecture 100 replaces each three-way multiplexer in the above described conventional implementation with a two-way multiplexer, and simplifies the interconnection of the various path memories.

Assuming each path memory A-H contains P+1 bits, P bits are shifted or transferred to another path memory. One may distinguish local interconnections, which are defined as internal shift register connections for a given path memory, for example, path memory A, from remote interconnections, which are defined as connections from one path memory to another, such as remote interconnections from path memory H to path memory A. Path memory architecture 100 requires P local and P remote interconnections for half of the path memories blocks A, C, E, and G, and 2P remote interconnections for the other half path memory blocks B, D, F, and H, for the total of SP/2 local and 3SP/2 remote interconnections when S is the number of states. This contrasts with SP local and 2SP remote for the above-described conventional implementation.

When each ACS decision is made, each path memory is loaded with one of two alternative path histories. In FIG. 12, the path memories may be loaded as follows:

A←((A<< ∧ 1) or (H<<1)
C←((C<< ∧ 1) or (B<<1)
E←((E<< ∧ 1) or (D<<1)
G←((G<< ∧ 1) or (F<<1)
B←((A<< ∧ 1) or (H<<1)
D←((C<< ∧ 1) or (B<<1)
F←((E<< ∧1) or (D<<1)
H←((G<< ∧ 1) or (F<<1), where J<<1 denotes the previous contents of path memory J shifted over one bit, k ∧ 1 denotes memory K appended with a 1, and the decision are made by the appropriate ACS unit.

Figure 13:
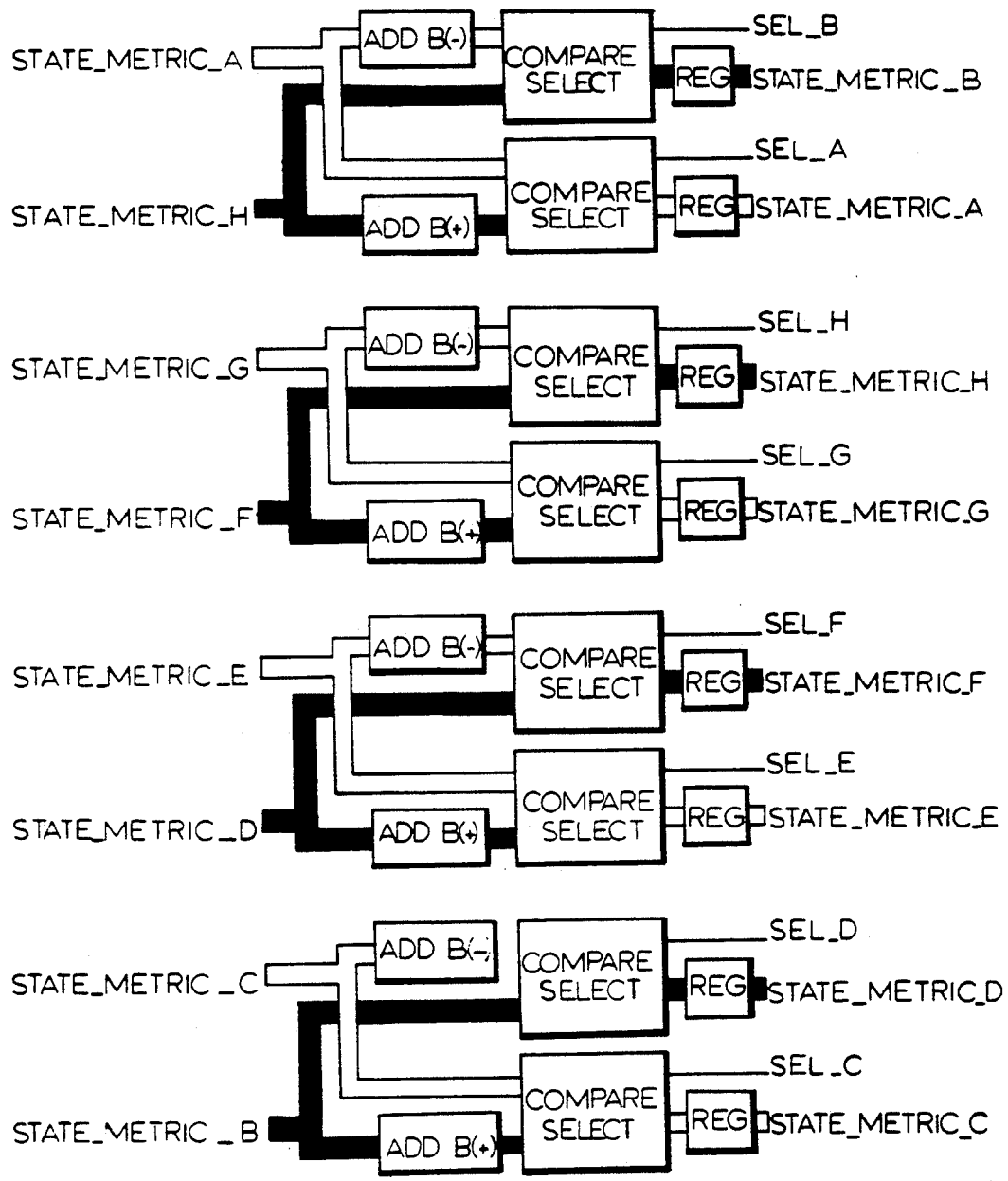
FIG. 13 is a schematic diagram illustrating add, compare, and select (ACS) circuitry having rotating state metrics according to the invention.

FIG. 13 is a schematic diagram illustrating add, compare, and select (ACS) circuitry 110 having rotating state metrics according to the invention. The association of appropriate ACS units with each path memory A-H may be understood with reference to FIGS. 12 and 13.

As described before, an ACS unit adds previous state metrics to branch metrics for each of two edges, compares these and selects a survivor. The branch metrics are a measure of the distance from the noisy sample to each of the noiseless sample values. Three branch metrics are processed at a time, the distance from a noiseless sample value of 0, which is denoted b(0), and the distance from the ideal positive and negative sample values, which are denoted by b(+) and b(−), respectively. Normalized branch metrics replace b(0) by zero, and detector 110 require additions for b(+) and b(−) only as illustrated in FIG. 13.

An ACS unit which operates on a horizontal row of FIG. 11 must alternatively compare a metric involving b(+) or b(−) to a metric involving b(0), and therefore requires a MULTIPLEXER to select between b(+) and b(−). In the simplified path memory architecture 100, the ACS units for the corner shift register path memory blocks A, C, E, and G in FIG. 12 exclusively compare a metric involving b(+) to a metric involving b(0), while the ACS units for the center path memory blocks B, D, F and H exclusively compare a metric involving b(−) to a metric involving b(0). Multiplexers for alternation of b(+) and b(−) can therefore be eliminated.

FIG. 13 illustrates add, compare, and select (ACS) circuitry 110 for adding the branch metrics to the proper state metrics by rotating the state metrics. The state metric registers REG's in FIG. 13 are preset to appropriate values for the desired initial association of numeric labelled ACS vertices and alphabetically labelled path memories.

In brief, a systolic add, compare and select circuit has been described that reduces and simplifies the amount of digital hardware required to implement the Viterbi detector for the rate 8/10 MSN trellis code. Modified butterfly trellis geometries according to the invention provide simplification of path memories.

While the invention has been described with reference to details of the illustrated embodiment, these details are not intended to limit the scope of the invention as defined in the appended claims.

What is claimed and desired to be secured by Letters Patent of the United States is:

1. Viterbi detector apparatus comprising:
   means for sequentially receiving consecutive trellis coded data samples; said trellis coded data having a preselected number S of allowed states and predefined allowed state transitions;
   systolic array add, compare and select (ACS) means responsive to received consecutive trellis coded data samples for recursively calculating and storing path metrics and partial sums of metric update equations for each state to select one of said states having minimum error; said systolic array add, compare and select (ACS) means includes S latches, each latch being used alternately for storing said calculated path metrics and partial sums: and
   path history means for storing said sequentially selected states for each state of said preselected number of allowed states.

2. Viterbi detector apparatus as recited in claim 1, wherein said systolic array add, compare and select (ACS) means is clocked at an encoded bit rate and a compare/select selects between said calculated path metrics and partial sums on alternate clock cycles.

3. Viterbi detector apparatus as recited in claim 1 wherein said systolic array ad, compare and select (ACS means recursively calculating and storing path metrics and partial sums of metric update equations according to an expression:
   $\min[M_n(k)+(1+2z_1 \text{ or } 2z_2), M_n(p)]$, wherein $z_1z_2$ represent said received consecutive trellis coded data; wherein said path metrics are represented by $M_n(i)$ and said partial sums are represented by $M'_n(j)$, where i and j are adjacent states.

4. Viterbi detector apparatus as recited in claim 1 wherein said systolic array add, compare and select (ACS) means includes S ACS blocks, each ACS block including a 2-input add, a 2-input multiplexer, a 2-input compare and said latch.

5. Viterbi detector apparatus as recited in claim 1 wherein said path history means for storing said sequentially selected states include S path memory blocks, each path memory being loaded with one of two alternative path histories with each selected state.

6. Viterbi detector apparatus as recited in claim 5 wherein said S path memory blocks include alternating shift registers with parallel loading capability and parallel registers each with a multiplexer selecting each input data bit, said alternating shift registers and parallel registers interconnected in a ring.

7. Viterbi detector apparatus as recited in claim 6 wherein each said path history block includes P+1 data bits, with P bits transferred to another path history block, said shift registers path memory blocks including P local internal shift register interconnections and P remote interconnections to another parallel register path memory block.

8. Viterbi detector apparatus as recited in claim 7 wherein said parallel registers path memory blocks including P remote interconnections to another parallel register path memory block and P remote interconnections to another shift register path memory block.

9. Viterbi detector apparatus as recited in claim 6 wherein said systolic array add, compare and select (ACS) means includes means for sequentially rotating state metrics.

10. A viterbi trellis coding method for processing digital data used with partial-response PR channel in a direct access storage device comprising the steps of:
    encoding binary data into trellis coded data, said encoded trellis data having a preselected number of allowed states and predefined allowed state transitions;
    applying said trellis coded data to the PR channel for writing data;
    receiving an output signal sequence from said PR channel for data readback; and
    utilizing a systolic array Viterbi detector for calculating maximum-likelihood received sequences, said systolic array Viterbi detector recursively calculating metric update equations;
    wherein alternating polarity channel output samples are sequentially applied to said systolic array Viterbi detector.

11. Viterbi detector apparatus comprising:
    means for sequentially receiving consecutive trellis coded data samples; said trellis coded data having a preselected number S of allowed states and predefined allowed state transitions;
    systolic array add, compare and select (ACS) mean responsive to received consecutive trellis coded data samples for recursively calculating and storing path metrics and partial sums of metric update equations for each state to select one of said states having minimum error; and
    path history means for storing said sequentially selected states for each state of said preselected number of allowed states, said path history means including S path memory blocks, each path memory being loaded with one of two alternative path histories with each selected state;
    wherein said path history means includes alternating shift registers with parallel loading capability and parallel registers each with a multiplexer selecting each input data bit, said alternating shift registers and parallel registers being interconnected in a ring.

12. Viterbi detector apparatus as recited in claim 11 wherein said systolic array add, compare and select (ACS) means includes S ACS units interconnected to sequentially rotate output states.

* * * * *

UNITED STATES PATENT AND TRADEMARK OFFICE
CERTIFICATE OF CORRECTION

PATENT NO. : 5,327,440
DATED : July 5, 1994
INVENTOR(S) : Fredrickson et al.

It is certified that error appears in the above-identified patent and that said Letters Patent is hereby corrected as shown below:

At column 4, line 28, "Ovk" should be changed to --O $\Psi$ k--;

At column 4, line 38, "$\{1+2z_2\}$" should be changed to --$\{1+2z_1\}$--;

At column 4, line 41, "$1-2z_1\}$" should be changed to --$\{1-2z_1\}$--;

At column 4, line 55, "$B_{1-1}-B_6$" should be changed to --$B_{1-1}-B_{6-6}$--;

At column 5, line 20, "$M_n(3)+1+2z,M_n(4)\}$" should be changed to --$M_n(3)+1+2z_1,M_n(4)\}$--;

At column 5, line 42, "$M_{n+1}(2) \rightarrow e_{min}$ and $PH_{n+1}(2) \rightarrow 00$" should be changed to --$M_{n+1}(2) \leftarrow e_{min}$ and $PH_{n+1}(2) \leftarrow 00$--;

At column 5, line 62, "1723-1328" should be changed to --1723-1728--;

At column 6, line 9, "$_1)+\min[M_n(2)+(1-2z_1),M_n(1)[\}$" should be changed to --$_1)+\min[M_n(2)+(1-2z_1),M_n(1)]\}$--;

UNITED STATES PATENT AND TRADEMARK OFFICE
CERTIFICATE OF CORRECTION

PATENT NO. : 5,327,440
DATED : July 5, 1994
INVENTOR(S) : Fredrickson et al.

It is certified that error appears in the above-identified patent and that said Letters Patent is hereby corrected as shown below:

At column 6, line 17,
"$_2)+\min[M_n(5)+(1+2z_1),M_n(6)[\}$" should be changed to
--$_2)+\min[M_n(5)+(1+2z_1),M_n(6)]\}$--;

Column 6, line 29, "$(1+2z_1$ or $2z_2)$" should be changed to --$(1\mp2z_1$ or $2z_2)$--;

Column 6, line 56, "on n alternate" should be changed to --on alternate--;

Column 6, line 66, "56 n and" should be changed to --56 and--;

Column 8, lines 38-46, every "$<<\wedge 1)$" should be replaced with --$<<1)\wedge 1)$--;

Column 9, claim 3, line 54, "ad" should be changed to --add--;

Column 9, claim 3, line 55, "(ACS" should be changed to --(ACS)--;

Column 9, claim 3, line 58, "$(1+2z_1$ or $2z_2)$" should be changed to --$(1\mp2z_1$ or $2z_2)$--;

Column 10, claim 10, line 25, "viterbi" should be changed to --Viterbi--;

UNITED STATES PATENT AND TRADEMARK OFFICE
CERTIFICATE OF CORRECTION

PATENT NO. : 5,327,440
DATED : July 5, 1994
INVENTOR(S) : Fredrickson et al.

It is certified that error appears in the above-indentified patent and that said Letters Patent is hereby corrected as shown below:

Column 10, claim 10, line 26, after "with" insert --a--; and

Column 10, claim 11, line 47, "mean" should be changed to --means--.

Signed and Sealed this

Fourth Day of October, 1994

Attest:

BRUCE LEHMAN

Attesting Officer     Commissioner of Patents and Trademarks